(12) United States Patent
Hoeppner et al.

(10) Patent No.: US 9,152,901 B2
(45) Date of Patent: Oct. 6, 2015

(54) METHOD FOR THE PRODUCTION OF A BOOK COVER INSERT AND BOOK-TYPE SECURITY DOCUMENT AND BOOK COVER INSERT AND BOOK-TYPE SECURITY DOCUMENT

(75) Inventors: Harald Hoeppner, Berlin (DE); Michael Radtke, Berlin (DE); Detlef Märtens, Berlin (DE); Manfred Paeschke, Basdorf (DE); Jens Ehreke, Berlin (DE); Thomas Löer, Berlin (DE); Rainer Seidel, Berlin (DE); Michael Knebel, Berlin (DE)

(73) Assignee: BUNDESDRUCKEREI GMBH, Berlin (DE)

( * ) Notice: Subject to any disclaimer, the term of this patent is extended or adjusted under 35 U.S.C. 154(b) by 2665 days.

(21) Appl. No.: 10/549,047

(22) PCT Filed: Mar. 8, 2004

(86) PCT No.: PCT/EP2004/002347
§ 371 (c)(1),
(2), (4) Date: Feb. 23, 2006

(87) PCT Pub. No.: WO2004/080726
PCT Pub. Date: Sep. 23, 2004

(65) Prior Publication Data
US 2006/0202795 A1   Sep. 14, 2006

(30) Foreign Application Priority Data

Mar. 12, 2003 (DE) ................................. 103 11 110
Feb. 20, 2004 (DE) .......................... 10 2004 008 841

(51) Int. Cl.
*G06K 19/00* (2006.01)
*G06K 19/06* (2006.01)
*G08B 13/14* (2006.01)
*G06K 19/02* (2006.01)
*G06K 19/077* (2006.01)
*B42D 25/29* (2014.01)

(52) U.S. Cl.
CPC .............. *G06K 19/025* (2013.01); *B42D 25/29* (2013.01); *G06K 19/07745* (2013.01); *H01L 2924/0002* (2013.01)

(58) Field of Classification Search
CPC ............. G06K 19/07745; B42D 24/29; H01L 2924/0002; H01L 2924/00
See application file for complete search history.

(56) References Cited

U.S. PATENT DOCUMENTS

| | | | | |
|---|---|---|---|---|
| 3,775,230 A | * | 11/1973 | Hilton | 428/106 |
| 4,187,337 A | * | 2/1980 | Romageon | 428/95 |
| 4,518,644 A | * | 5/1985 | Vuorio | 428/198 |
| 4,569,873 A | * | 2/1986 | Robbins | 428/106 |
| 4,615,936 A | * | 10/1986 | Baum | 442/413 |
| 4,697,073 A | * | 9/1987 | Hara | 235/487 |
| 4,792,843 A | * | 12/1988 | Haghiri-Tehrani et al. | 257/679 |

(Continued)

FOREIGN PATENT DOCUMENTS

WO   WO 02089052 A1 * 11/2002 ........... G06K 19/077

*Primary Examiner* — Daniel Walsh
(74) *Attorney, Agent, or Firm* — Kriegsman & Kriegsman

(57) ABSTRACT

The invention relates to a method for the production of a book cover insert (11) and to a method for the production of a book-type security document (30) and also to a book cover insert and a book-type security document, in which at least one data carrier (22) that can be operated contactlessly is provided in a book cover insert (11). (In this respect FIG. 9).

5 Claims, 4 Drawing Sheets

(56) References Cited

U.S. PATENT DOCUMENTS

Figure 6A:
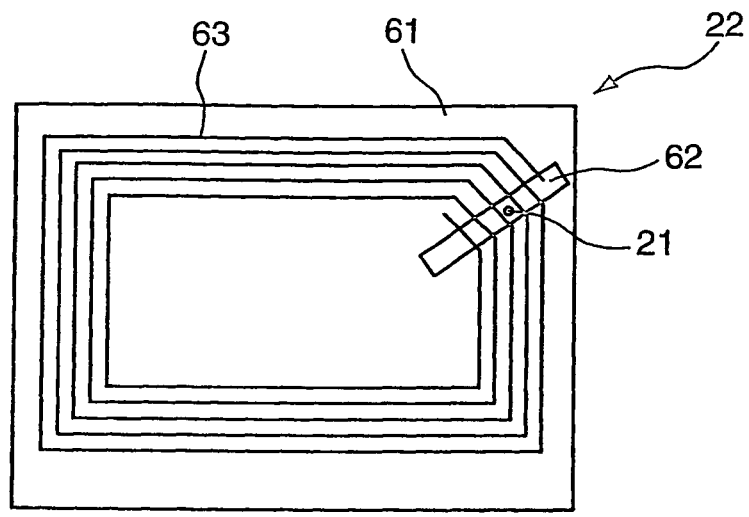

| | | | | |
|---|---|---|---|---|
| 5,417,575 A * | 5/1995 | McTaggart | 434/317 |
| 5,418,034 A * | 5/1995 | McGuire, III | 428/106 |
| 5,484,292 A * | 1/1996 | McTaggart | 434/317 |
| 5,528,222 A * | 6/1996 | Moskowitz et al. | 340/572.7 |
| 5,609,936 A * | 3/1997 | Kohler et al. | 428/107 |
| 5,613,349 A * | 3/1997 | Brown | 53/453 |
| 5,677,524 A * | 10/1997 | Haghiri-Tehrani | 235/492 |
| 5,842,722 A * | 12/1998 | Carlson | 283/107 |
| 5,980,676 A * | 11/1999 | Meetze | 156/216 |
| 6,100,804 A * | 8/2000 | Brady et al. | 340/572.7 |
| 6,375,058 B1 * | 4/2002 | Passamoni | 225/49 |
| 6,395,373 B2 * | 5/2002 | Conti et al. | 428/138 |
| 6,569,508 B2 * | 5/2003 | Babb et al. | 428/40.1 |
| 6,729,543 B1 * | 5/2004 | Arons et al. | 235/462.13 |
| 6,888,509 B2 * | 5/2005 | Atherton | 343/718 |
| 7,116,231 B2 * | 10/2006 | Kayanakis et al. | 340/572.7 |
| 7,224,278 B2 * | 5/2007 | Phaneuf et al. | 340/572.1 |
| 7,368,032 B2 * | 5/2008 | Green et al. | 156/264 |
| 7,479,882 B2 * | 1/2009 | Mahaffey | 340/572.3 |
| 7,940,185 B2 * | 5/2011 | Rancien et al. | 340/572.8 |
| 8,072,330 B1 * | 12/2011 | Nichols, Sr. | 340/572.1 |
| 8,441,403 B2 * | 5/2013 | Peters et al. | 343/741 |
| 2001/0011948 A1 * | 8/2001 | Rasband | 340/572.5 |
| 2001/0023366 A1 * | 9/2001 | Usui | 607/111 |
| 2002/0025416 A1 * | 2/2002 | Uchibori | 428/209 |
| 2002/0064436 A1 * | 5/2002 | Marsh | 412/1 |
| 2002/0125546 A1 * | 9/2002 | Muta | 257/531 |
| 2002/0145049 A1 * | 10/2002 | Lasch et al. | 235/488 |
| 2002/0151947 A1 * | 10/2002 | Usui | 607/111 |
| 2002/0170973 A1 * | 11/2002 | Teraura | 235/492 |
| 2003/0057286 A1 * | 3/2003 | Yamagishi et al. | 235/492 |
| 2003/0168514 A1 * | 9/2003 | Rancien et al. | 235/492 |
| 2003/0214794 A1 * | 11/2003 | Takahashi et al. | 361/761 |
| 2003/0226901 A1 * | 12/2003 | Kim et al. | 235/492 |
| 2004/0029030 A1 * | 2/2004 | Murray | 430/130 |
| 2004/0129788 A1 * | 7/2004 | Takahashi et al. | 235/492 |
| 2004/0159709 A1 * | 8/2004 | Ohta et al. | 235/492 |
| 2005/0066513 A1 * | 3/2005 | Kayanakis et al. | 29/592.1 |
| 2005/0128085 A1 * | 6/2005 | Bon | 340/572.7 |
| 2005/0263234 A1 * | 12/2005 | Shih | 156/60 |
| 2005/0274794 A1 * | 12/2005 | Bason et al. | 235/380 |
| 2005/0275540 A1 * | 12/2005 | Halope et al. | 340/572.8 |
| 2006/0035052 A1 * | 2/2006 | Shih | 428/44 |
| 2006/0062955 A1 * | 3/2006 | Liu et al. | 428/40.1 |
| 2006/0109123 A1 * | 5/2006 | Carrender | 340/572.1 |
| 2006/0176181 A1 * | 8/2006 | Halope | 340/572.8 |
| 2006/0273170 A1 * | 12/2006 | Forster et al. | 235/432 |
| 2006/0290498 A1 * | 12/2006 | Rawlings et al. | 340/572.1 |
| 2007/0063058 A1 * | 3/2007 | Iwakata et al. | 235/492 |
| 2007/0216534 A1 * | 9/2007 | Ferguson et al. | 340/572.7 |
| 2007/0257797 A1 * | 11/2007 | Rancien et al. | 340/572.1 |
| 2008/0135623 A1 * | 6/2008 | Leenders et al. | 235/488 |
| 2008/0179404 A1 * | 7/2008 | Finn | 235/492 |
| 2008/0180255 A1 * | 7/2008 | Isabell | 340/572.8 |
| 2008/0193713 A1 * | 8/2008 | Hahn et al. | 428/130 |
| 2008/0297350 A1 * | 12/2008 | Iwasa et al. | 340/572.1 |
| 2009/0026751 A1 * | 1/2009 | Rancien et al. | 281/29 |
| 2009/0047525 A1 * | 2/2009 | Tilton | 428/441 |
| 2009/0115611 A1 * | 5/2009 | Kobayashi et al. | 340/572.1 |
| 2009/0242647 A1 * | 10/2009 | Kim | 235/492 |
| 2010/0277443 A1 * | 11/2010 | Yamazaki et al. | 345/204 |
| 2010/0282855 A1 * | 11/2010 | Rancien et al. | 235/492 |

* cited by examiner

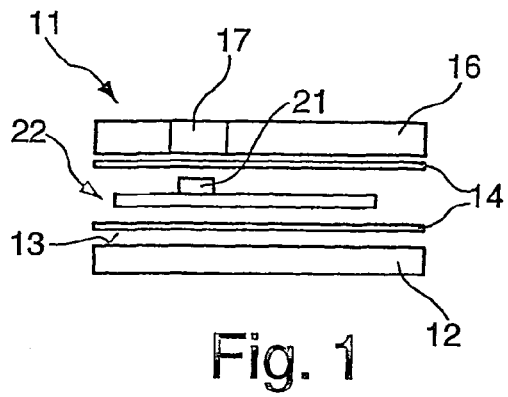
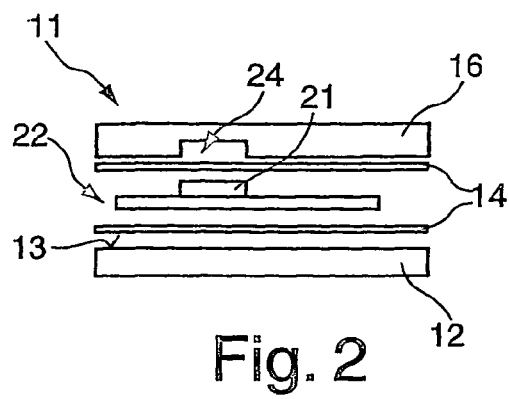
Fig. 1          Fig. 2
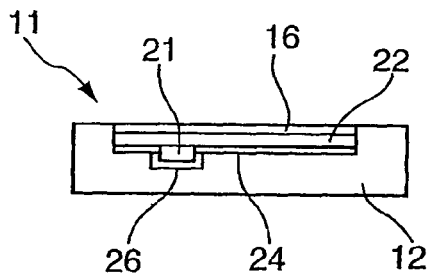
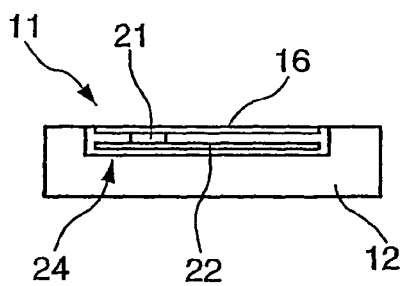
Fig. 3          Fig. 4
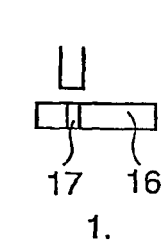 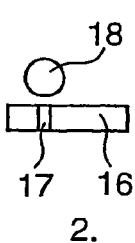 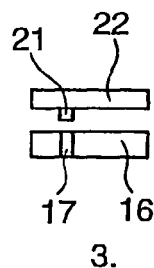 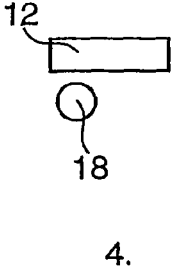
1.   2.   3.   4.
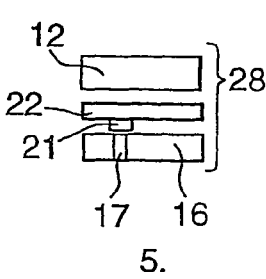 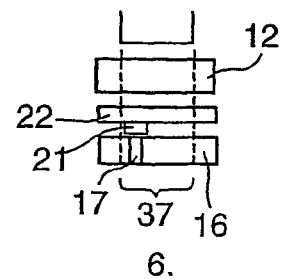
5.   6.
Fig. 5

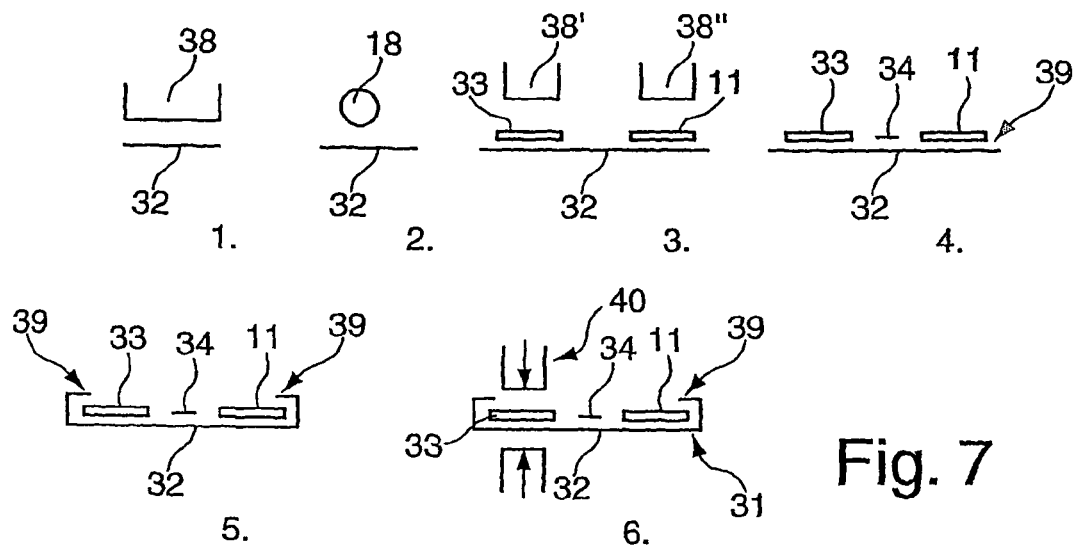
Fig. 7
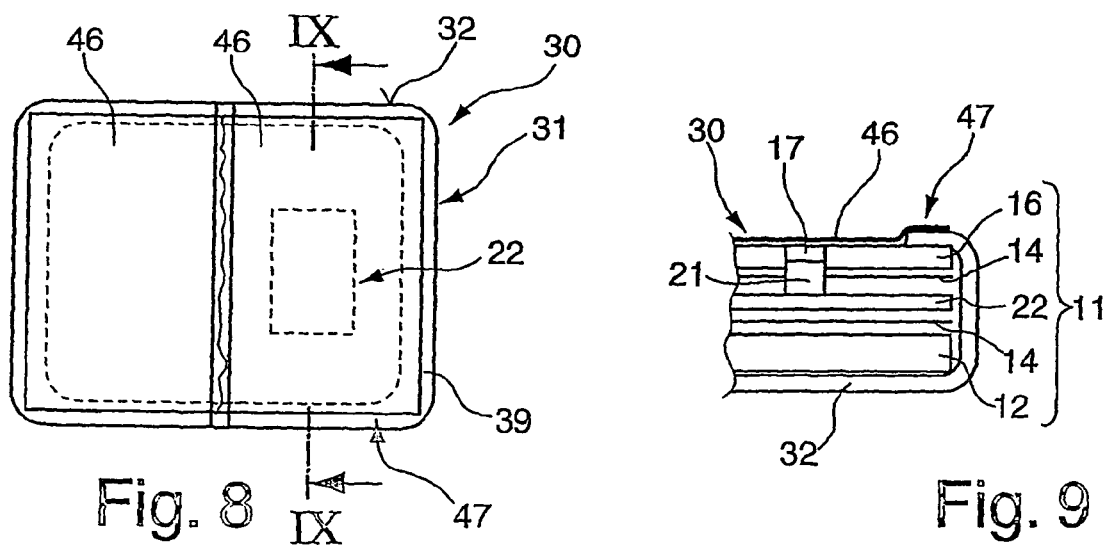
Fig. 8
Fig. 9

METHOD FOR THE PRODUCTION OF A BOOK COVER INSERT AND BOOK-TYPE SECURITY DOCUMENT AND BOOK COVER INSERT AND BOOK-TYPE SECURITY DOCUMENT

The invention relates to a method for the production of a book cover insert, to a method for the production of a book-type security document and also to a book cover insert and a book-type security document, in particular a pass book.

A book-type security document, such as, for example, a passport or the like, comprises a book block and a pass card, which are connected to one another before they are bound with a book binding to form a pass book. The book block is produced from a paper or paperlike material comprising security features. The pass card has a multiplicity of security features. In the case of a passport, the book block is personalized appropriately with respect to the pass card.

There is considerable interest in protecting book-type security documents against forgery and in making the production of forgeries technically impossible or at least not economically viable. Moreover, the intention is to enable straightforward checkability and monitor ability of intermediate products for book-type security documents or for security documents themselves.

EP 0 749 620 B1 discloses a method for binding books in which a security facility in the form of a magnetic strip or microchip is adhesively bonded on prior to the binding of the book cover with the book inserts into the spine of the book. This fitting of the security facility on the inner side of the book spine is intended to serve as antitheft protection. Although this fitting on the inner side of the book spine is invisible externally, it is easy to manipulate or remove on account of the adhesively bonded-on arrangement. Moreover, this arrangement does not constitute a realistic protective measure for making forgeries technically impossible or at least not economically viable.

DE 196 01 358 C2 furthermore discloses a paper having an integrated circuit which contains predetermined data, can be read contactlessly and is embedded non-releasably in a paper pulp. This integrated circuit serves for increasing the forgeryproofness in the complexity of the production process. The embedding of an integrated circuit in a paper pulp means that a complicated papermaking method is required for embedding said integrated circuit. The mechanical stability of the integrated circuits is very low, so that there is the risk of damage as early as while the integrated circuit is being introduced into the paper pulp and during later processing methods, such as printing.

Therefore, the invention is based on the object of providing a method for the production of a book insert and a book-type security document with a book insert and also a book cover insert and a book-type security document in which the forgeryproofness is increased and simple checking of authenticity is made possible.

This object is achieved by means of a method for the production of a book cover insert and the production of a book-type security document and also a book cover insert and a book-type security document in accordance with claims 1, 12, 20 and 24.

The method according to the invention provides a book cover insert having at least one data carrier with microchip which can be operated contactlessly or is contact-connectable and which is provided within the outer sides of the book cover insert, which comprises at least one first layer and at least one further layer. The at least one data carrier with microchip is not visible by virtue of the layered construction and is also provided in a manner such that it cannot be sensed in the book cover insert. As a result, the position of the at least one data carrier with microchip also cannot be determined or can only be determined with an elevated outlay.

Said at least one data carrier introduced in the book cover insert constitutes an additional security feature. At the same time, the at least one data carrier can be connected or coupled to further security features provided in the book cover insert and/or in a book block or book-type security document. The number of security documents produced and in circulation which have the book cover inserts can be ascertained, so that the forgery rate can be detected. The layers and the at least one data carrier are connected to one another under slight pressure to form a composite, so that the at least one data carrier is incorporated securely and functionally.

After the introduction of the at least one data carrier with microchip which can be operated contactlessly or is contact-connectable and the application of the at least one further layer covering the at least one data carrier, the production of the book cover inserts advantageously comprises a stamping process by means of which the book cover insert is stamped to a final format for a book-type security document. This makes it possible to define the predetermined position of the at least one data carrier in the book cover insert, thereby ensuring, during the processing of the book cover insert for the production of a book-type security document, that the at least one data carrier is not impaired or damaged in the further processing steps. By way of example, transport gripping elements will engage outside the positioning region of the at least one data carrier.

The book cover insert advantageously has the at least one first layer of the book cover insert made of stronger paper, paperboard or cardboard. This provides for secure accommodation of at least one data carrier, so that the functionality remains ensured even upon relatively lengthy use of the book cover insert in a book-type security document.

According to one advantageous refinement of the book cover insert, it is provided that the first and at least one further layer are formed from the same material, such as, for example, reinforced paper, paperboard or cardboard, and, prior to the connection of the at least two layers, the direction of the paper fibers of the first and at least one further layer are oriented in the same sense. This makes it possible to form a book cover insert with at least two plane-parallel layers, with the result that a non-warping arrangement is provided.

According to a further advantageous refinement of the invention, it is provided that the adhesive layer is applied on a side having a rough surface of the at least one layer made of reinforced paper, paperboard, cardboard or the like. Owing to the use of reinforced paper, paperboard or cardboard, the at least one layer of one side has a rough surface, and on the other side a smooth surface. For secure positioning of the at least one data carrier and to increase the cohesion of the composite, the rough surface is provided with an adhesive layer on which lies at least in part the data carrier and the at least in part one further layer.

In an advantageous manner, an alternative refinement of the invention provides for the first and at least one further layer also to be formed from at least one polymeric laminate layer, so that a composite with a circumferential edge around the at least one data carrier is produced. As a result of the at least one data carrier being completely enclosed or embedded in a pocket or encapsulation, the accessibility to the data carrier is made more difficult. This laminate layer encapsulation makes it possible to provide a flexible pass cover which, moreover, will withstand elevated loads over many years.

The first and at least one further layer are preferably produced from at least one thermoplastic film or from a sandwichlike film combination. These films may preferably also be formed in transparent fashion. The individual materials or material combinations and also the sandwichlike construction may be selected in a manner dependent on the desired thickness and the strength or the requirements for fitting security features into the laminate layer.

An alternative development of the invention provides for the first or at least one further layer to be produced from a material containing an antenna substrate. This makes it possible to provide for the use of chip modules with an external coil or antenna, which form a transponder unit by means of contact-connection at the contact locations of the antenna substrate. Said antenna substrate may have thicknesses in the range of between 6 and 150 μm, for example, and, depending on the required contact-connecting method, comprise PIT, PI, FR-4, Aramit, PVC, ABS, PE, PA, PP, PE, Teslin or the like. The antenna coils may advantageously be produced from enamel-insulated metal wire, in particular copper wire, by means of, for example, an ultrasonic sonotrode laying technique. Said antenna coils may also be inserted as an air-core coil into a corresponding recess and be laminated. Embodiments produced by means of polymeric and conductive pastes using screen printing technology may likewise be provided. As an alternative, it is also possible to use flexible printed circuit boards using subtractive technology, in the form of etching technology in copper or aluminum or the like.

In addition to the advantage for forming a flexible pass cover, the configuration of the first and at least one further layer from at least one laminate layer furthermore exhibits the possibility that further security features that increase the forgeryproofness may be provided into the surface of the laminate layer or between a sandwichlike construction of the film combinations.

According to a further advantageous refinement of the invention, it is provided that the first and at least one further layer are joined together by heating a hot melt adhesive. The upper limit for the heating temperature is advantageously limited to a maximum of 200° C., in particular to 160° C., in order to protect the at least one data carrier against adverse effects.

According to a further advantageous refinement of the invention, it is provided that there is introduced in at least one first layer a cutout by means of a processing operation, a cavity or perforation introduced during the production of the layer by means of stamping. The concrete extent and dimensions of the cutouts or cavities or of the perforations may be introduced in a manner dependent on the data carrier used. The cutout, cavities and/or perforations are preferably introduced before an adhesive layer is applied.

The book cover insert according to the invention, which has at least one data carrier with microchip, comprises a first and at least one further layer that surround the at least one data carrier. The integration or incorporation of the at least one data carrier into a book cover insert makes it possible to enhance the security features in the case of books, security documents, certificates or further jackets or bindings provided for documents, articles or the like. By virtue of the arrangement that is not visible and cannot be sensed, this security feature cannot immediately be ascertained, which already affords an increase in security. Moreover, the information of the at least one data carrier may be combined with further security features. There may be, by way of example, inductive, capacitive, magnetic coding, infrared coding, Wiegand coding, etc., which are situated either separately in the book cover insert or in conjunction with the further component parts to which the book cover insert is assigned.

According to one advantageous refinement of the invention, it is provided that the first or at least one further layer comprises a layer thickness which is less than or equal to the total layer thickness or a thickness of a composite which is formed from a plurality of layers. The book cover inserts are traditionally provided with a layer thickness of 550 μm, for example. The layer construction or layer composite is formed identically or smaller and comprises at least one data carrier with microchip. As a result, a book cover insert can be integrated into the previous production methods and the visual appearance can be preserved.

According to one advantageous refinement of the book cover insert, it is provided that provision is made of a first and a second layer made of paperboard or cardboard which have an identical wall thickness. This affords a very simple production process since identical materials and material thicknesses are used. The wall thickness of the first and second layers is coordinated with the thickness of the construction of the at least one data carrier and the adhesive layers.

According to an alternative refinement of the book cover insert, it is provided that at least one first layer is formed from reinforced paper, paperboard, cardboard or the like, which has a cutout or depression in which the at least one data carrier and the at least one further layer are introduced. The at least one further layer covering the data carrier may be provided from the same material as the first layer or a material that deviates therefrom. By way of example, flowable and curable plastics, casting resins or embedding compositions may be provided.

According to one preferred embodiment, the book cover insert has at least one first layer comprising additional security features. Said security features, such as a metal thread for example, may interact with the at least one data carrier in order to form a more complex security feature and to make forgery more difficult.

The book cover insert is provided in particular for the production of a book binding provided for a book-type security document. The book-type security document may be for example a passport or some other security document whose specification and construction can be adapted to different security levels and security requirements.

The method according to the invention for the production of a book-type security document furthermore has the advantage that a small number of work steps are used to create a book-type security document composed of a plurality of components which are in each case formed with security features and can preferably be combined with one another. The non-sensing and non-seeing of the at least one data carrier already constitutes a security feature.

According to a further advantageous refinement of the method, it is provided that when the book block is inset in the book binding, the endpaper is adhesively bonded onto the inner front and rear sides of the book binding. As a result, the book cover is completely surrounded and closed by the binding material and the endpaper, so that the materials used in book binding covers and a positioning of the at least one data carrier cannot be discerned externally.

Furthermore, the invention makes it possible that when a perforation, for example, is introduced into the at least one layer, adhesive bonding or concealment by the endpaper suffices to prevent the perforation from being sensed. The endpaper of the book block is advantageously formed from a paper having a weight of more than 80 g/m$^2$.

It is advantageously provided that a book cover with at least one data carrier is provided on a rear side of the book binding and the front side is formed by a pass cover without a data carrier. As a result, on the outer side of the book binding, in a further processing operation, by way of example, it is possible to effect hot embossing or further embossing and processing methods in order to apply inscriptions and markings of the security document.

The book-type security document according to the invention has the advantage that the introduction of at least one data carrier increases the forgeryproofness. In the event of manipulations, it is not only necessary for at least one data carrier with microchip to be introduced into the book cover insert, but it is likewise necessary to take account of the fact that a further data matching with further security features of the book block is to be performed. There may be stored in the data carrier security data, personal data for example from the pass card and further items of information which can in turn be read in and interrogated only by means of special read-out devices. As a result, the book binding can be combined with the book block. Furthermore, a number of the blank pass may already be stored with/or without a check digit in the data carrier. As a result of this and as a result of, if appropriate, further combinations with security features, it is possible to provide an enhancement of the security with regard to falsification and exchange with respect to the book block or a pass card.

Furthermore, biometric data, for example fingerprints or data from the machine-readable lines of a pass card, may be stored in the data carrier that operates contactlessly, so that further person-specific data are stored in the security document. The introduction of the at least one data carrier into the book cover insert may furthermore also be used for position finding. Furthermore, the invention's configuration of a book-type security document with a book cover insert comprising at least one data carrier has the advantage of enabling a linking of the book cover insert to the book block or to the pass card or identification card.

Furthermore, it may advantageously be provided that a data carrier is introduced in each case and/or at least in part for example on the front and/or rear side of the book binding. The stored items of information are split, with the result that one portion of the items of information is stored on a first data carrier and a further portion of the items of information is stored on the at least further data carrier, any desired division of the stored data being made possible. This storage of the data together with the interrogation of personalized data on a pass card or identity card or items of information of the book block furthermore increase the forgeryproofness of such a book-type security document. Furthermore, parts of the at least one data carrier may be provided on the rear side, the front side and/or the spine, which may also be combined with one another by means of connecting locations. In this case, the combination or division of one or more data carriers may already constitute a security feature.

Further advantageous refinements and developments of the invention are specified in further claims.

Figure 6:
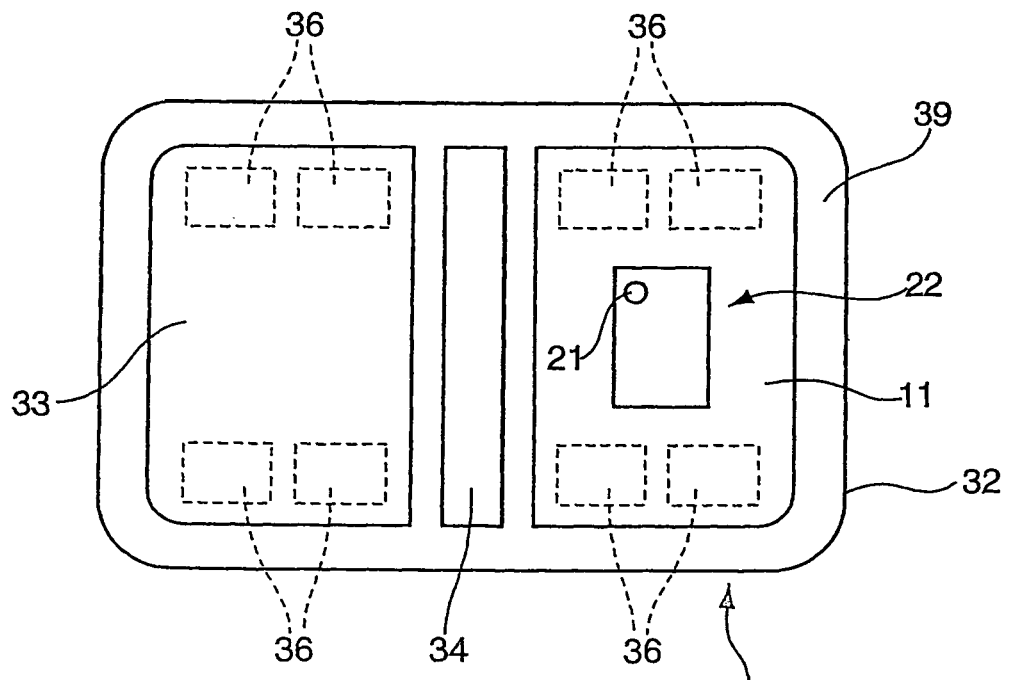
Figure 10A:
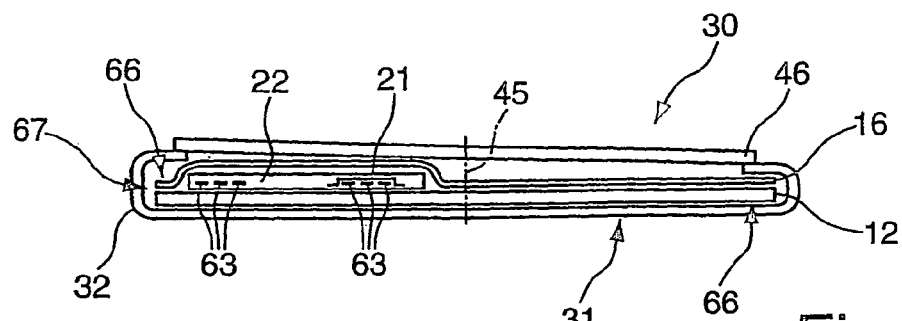
Figure 10B:
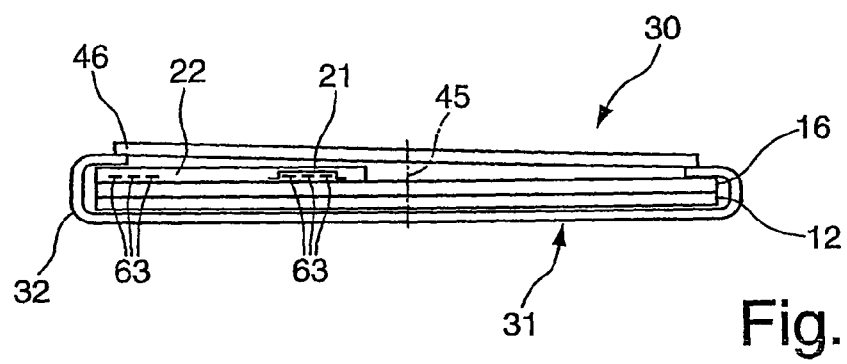
Figure 11:
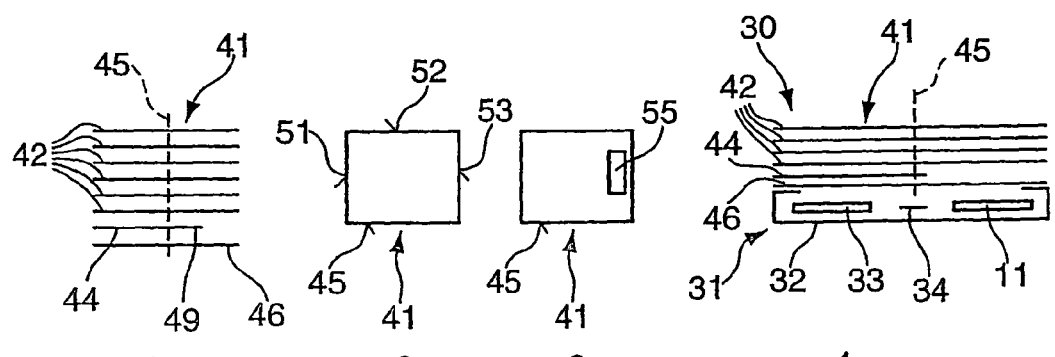

The invention and also further advantageous embodiments and developments thereof are described and explained in more detail below on the basis of the example illustrated in the drawing. The features that can be gathered from the description and the drawing may be employed according to the invention individually by themselves or as a plurality in any desired combination. In the figures:

FIG. 1 shows a schematic sectional illustration of a book cover insert according to the invention, FIG. 2 shows a schematic sectional illustration of an alternative embodiment to FIG. 1, FIG. 3 shows a schematic sectional illustration of a further alternative embodiment to FIG. 1, FIG. 4 shows a schematic sectional illustration of an alternative embodiment to FIG. 3, FIG. 5 shows a schematic illustration of individual method steps for the production of a book cover insert according to the invention in accordance with FIG. 1, FIG. 6 shows a schematic plan view of a book binding with at least one book cover insert according to the invention, FIG. 6a shows a schematic plan view of a data carrier with microchip, FIG. 7 shows a schematic illustration for the production of a book binding with a book cover insert according to the invention, FIG. 8 shows a schematic plan view of a book-type security document according to the invention, FIG. 9 shows a schematic sectional illustration of a rear side of the book-type security document in accordance with FIG. 8, FIG. 10a shows a schematic sectional illustration of a flexible book binding according to the invention, FIG. 10b shows a schematic side view of an alternative embodiment of a book binding to FIG. 10a, and FIG. 11 shows a schematic illustration of the method steps for the production of the book-type security document.

Alternative embodiments of a book cover insert 11 according to the invention are illustrated by way of example in FIGS. 1 to 4. Said book cover insert 11 can be used diversely and is not restricted to the use of book-type security documents such as passports, for example. Such book cover inserts 11 can equally be used for safeguarding against forgeries in the case of books, certificates or other articles in which the book cover insert can also be used independently of the function of a book cover, such as, for example, as an underlay, insert or overlay.

The book cover insert 11 in accordance with FIG. 1 comprises a first layer 12, which is advantageously formed from reinforced paper, paperboard or cardboard. The first layer 12 has a rough surface and a smooth surface. The rough surface side forms the inner side 13, to which an adhesive layer 14 is applied. The at least one further layer 16 or, in accordance with the exemplary embodiment, the second layer 16 corresponds to the first layer 12 and likewise receives an adhesive layer 14 on the rough side forming the inner side 13. A perforation 17 is introduced into the second layer 16, said perforation serving for receiving a projecting microchip 21 of a data carrier 22. By way of example, the microchip 21 may be arranged in said perforation 17. The total layer thickness of the book cover insert 11 comprises 550 µm, by way of example. The layers 12 and 16 are preferably identical in thickness and formed from the same material and have in each case 250 µm, by way of example. The remaining 50 µm are taken up by the adhesive layer and the data carrier 22. This construction and the dimensions thereof are only by way of example. It is conceivable, as an alternative, that for example the layer 16 is made significantly thicker than the layer 12 or vice versa, the other layers 12, 16 being adapted to the thickness of the first layer. It may equally be provided that one of the two layers 12, 16 is formed from paperboard, reinforced paper or cardboard, the further layer being produced from plastics material. The layers 12, 16 may also be formed by a plurality of laminated layers. It is also possible for different materials to be selected for a layer construction made of at least two layers 12, 16. In principle, there is no limitation imposed on the material selection, but light, nonconductive materials such as paper, textile fabric, plastic or films, preferably made of recyclable material, are advantageously provided.

FIG. 2 illustrates a book cover insert 11 with a construction corresponding to that of FIG. 1. In a departure from FIG. 1, this exemplary embodiment has a cutout 24 serving for receiving a projecting microchip 21 of a data carrier 22. Said cutout 24 may be provided by means of a milling operation or an embossing operation. As an alternative, it is also possible to introduce a cavity in the layer even during production in order to position the data carrier 22 therein. The edges of the cutout may also be beveled or rounded.

FIG. 3 illustrates an alternative embodiment to FIG. 1. A first layer 12 comprises, in the edge region, a total layer thickness for the book cover insert. A milled-out section or cutout 24 adapted to the form of the data carrier 22 to be introduced is provided in a central region. The cutout or depression may also be formed by means of a multilayered construction. The depth of the cutout corresponds at least to the structural height of the data carrier 22 and a layer thickness of a second layer 16. Said second layer 16 may be composed of the same material as the layer 12. It may equally be provided that a casting resin, an embedding composition or the like is provided. It is equally possible for a protective film to be laminated on in order to form a plane surface. By way of example, a cup-shaped depression 26 is introduced in order to receive the microchip 21 of the data carrier 22.

The embodiments in accordance with FIGS. 1, 2 and 3 have the common feature that the perforation 17 or the cutout 24, 26 serves for receiving the at least one microchip 21 of the data carrier 22 and defines the further positioning very precisely in order to ensure that the data carrier 22 is received in a positionally precise manner between the layers 12, 16 in the book cover insert 11.

FIG. 4 illustrates a further alternative embodiment of the book cover insert 11, in the case of which a u-shaped cutout or milled-out section 24 is introduced on a preferably rough surface side of the layer 12. The construction and the embodiment variants correspond to those in accordance with FIG. 3. The microchip 21 of the data carrier 22 may also be arranged in a manner lying downward in the cutout 24 in accordance with FIG. 4.

The book cover inserts 11 in accordance with FIGS. 3 and 4 are preferably positioned in a book binding in such a way that the second layer 16 has an endpaper 46 adhesively bonded over it, as will be explained below.

FIG. 5 illustrates a plurality of work steps by means of which a book cover insert 11 is produced.

A first layer 16, having external dimensions larger than the final size, is supplied to a stamping machine for the purpose of introducing a perforation 17, the perforation 17 being introduced in a positionally precise manner in said stamping machine. In a subsequent step, an adhesive layer is applied on the inner side 13 of the layer 16 by means of a roller 11, a doctor blade or the like. As an alternative, a so-called transfer adhesive provided on a film may also be involved. The film is stripped away after the adhesive has been applied on the layer 16. Further adhesives may equally be used which, in particular, are adapted to and coordinated with the materials of the layers 12, 16. Furthermore, the adhesive layer may be applied to the data carrier 22, or on the layer and to the data carrier 22. Likewise, the data carrier 22 may be provided with a single- or double-sided adhesive layer which is protected by a protective film and stripped off prior to adhesive bonding. Afterward, the data carrier 22 is applied in a positionally precise manner with respect to the layer 16. Simultaneously or subsequently, the layer 12 is provided with adhesive on the inner side 13. As an alternative, an adhesive may be applied only or additionally on the front and/or rear side of the data carrier 22. In a fifth step, the components are positioned with respect to one another and adhesively bonded under slight pressure. A heating may be effected depending on the adhesive used, said heating being provided at at least less than 2000, advantageously ≤160°. In the case where identical materials are used for the layer 12 and 16, the paper fiber orientation of the first layer 12 and further layer 16 will be effected in the same sense, thereby enabling plane adhesive bonding, in particular with direct contact and preventing subsequent warping or bulging. This adhesively bonded composite 28 is stamped to a final format in a subsequent work step. This directly succeeding work step has the advantage of ensuring an exact positioning of the at least one data carrier 22 in the finished book cover insert 11, since the perforation 17 and introduction of the data carrier 22 are tailored to a reference size to which the stamping to the final format 37 is also geared. The book cover insert 11 stamped to the final format 37 is then made available for the production of a book binding 31 in a magazine.

FIG. 6 illustrates a book binding 31. This book binding 31 comprises a binding material 32 usually produced from a stock-like material. On the binding material 32, provision is made of a book cover insert 33 without a data carrier 22 for the front side of a book-type security document. A book cover insert 11 is provided for the rear side. A spine insert 34 is arranged in between. The book spine reinforcement or spine insert 34 usually comprises a paper strip. In an advantageous manner, these three inserts 11, 33 and 34 are not connected to one another. However, it is also possible to provide one- or two-part inserts.

The data carrier 22 is preferably arranged in a central region of the book cover insert 11. Gripper zones 36 are illustrated by dashed lines in the edge regions; they are preferably kept free in order to prevent damage to the data carrier 22 by means of gripping elements in automatic production in the course of transporting the book binding 31. The arrangement of the gripper zones 36 is to be adapted to the positioning of the data carrier, so that the gripping zones adjoin the data carrier and are provided outside the data carrier 22. In principle, the positioning of the data carrier 22 is possible arbitrarily with respect to the book cover insert 11.

The arrangement of one data carrier 22 in the central region of the book cover insert 11 is only by way of example. One or a plurality of data carriers 22 may in each case be provided in the front and back book cover inserts 11. Likewise, it is possible for at least parts of the data carrier or data carriers 22 to extend from the rear side as far as the spine insert 34 or from the front side as far as the spine insert 34. It is equally possible for one part, for example an antenna, to extend from the front side via the spine insert 34 as far as the rear side of the book cover insert 11. The configuration is application-specific here. It is also possible to provide parts of the data carrier, for example coils for the antenna, in a book cover insert 11 and the storage medium or the chip in the second book cover insert 11.

The data carrier 22 illustrated in FIG. 6 is illustrated in enlarged fashion in FIG. 6a.

Said data carrier comprises a film as carrier on which a microchip 21 is applied. The microchip 21 is connected via a conductor plane 62 to an antenna 63 formed by a multiplicity of conductor tracks arranged in looped fashion. Said data carrier 22 can be operated contactlessly, the distance for reading out and in being dependent on the transmission and reception power. The number of conductor tracks can be increased or enlarged for this, especially as the conductor tracks can also extend on the front and rear sides. The data carrier is formed as a transponder. Further embodiments that can be operated contactlessly can likewise be used. Integrated circuits can also be introduced.

At the present time, data carriers 22 of the ID1 format, having storage capacities of 4 KB, for example, are preferably used. The data carriers 22 that are used may be formed diversely, for example as an RFID version, as a unidirectional integrated circuit, and also have a bidirectional circuit. Chips having a personal code number may equally be provided. Furthermore, it is possible to introduce memories which enable forgeryproof crypto-programming techniques to be adopted. The microchips used for the data carriers 22 are adapted to the security stipulations. The data can be read out capacitively, magnetically or inductively depending on the coding. The capacitive and inductive read-out may be provided by modulation of the AC voltage. Furthermore, so-called Wiegand codings may also be provided. The items of information are formed by the geometrical position of the Wiegand wires. Furthermore, it is also possible to use contact-connectable data carriers, such as, for example, chips or micromodules without an antenna. The contact locations may for example be integrated in motifs and be formed by conductive color pigments.

If a plurality of data carriers 22 are provided in a book cover insert 11, the items of information can also be split, so that one portion of the items of information is stored in a first data carrier and a further portion is stored in a second data carrier, etc. If further security features are deliberately made visible, they may also be read out by means of light or an emitted radiation. As an alternative or in addition, infrared codings may also be provided.

FIG. 7 illustrates the individual steps for the production process of a book binding 31. The binding material 32 is provided from a magazine 38. One side of the binding material 32 is provided with an adhesive by means of a roller 18, by way of example. Organic glue that sets rapidly is preferably used. In a next step, a book cover insert 33 is applied via a first magazine 38' and a book cover insert 11 is applied from a second magazine 38". At the same time or in a subsequent step, the spine insert 34 may be positioned in between. The edge regions 39 of the binding material 32 are folded over and adhesively bonded to the book cover inserts 33 and 11. Afterward, a hot film embossing 40 or an embossing method is effected on the front side of the book binding 31. The position of the data carrier 22 is to be coordinated in a manner dependent on the embossing in order that the embossing is effected outside the region of the at least one data carrier 22 or the data carrier 22 is positioned outside the embossing.

FIGS. 8 and 9 illustrate a book-type security document 30 according to the invention. This book-type security document 30 is constructed from a book binding 31, a book block 41 and a pass card 44 (FIG. 10). The individual pages of the book block 41 and also the pass card 44 are not illustrated in the plan view of FIG. 8. In the case of a passport, the book block 32 usually comprises pages made of a standard paper with security features. The pass card 44, which is preferably stitched with the book block 41, is personalized.

The plan view shows that the endpaper 46 of the book block 41 is adhesively bonded on the book binding 31 in accordance with FIG. 9, thus resulting in an overlap region 47 of the endpaper 46 with respect to the folded-over binding material 32. As a result, the book cover insert 11 is completely encapsulated.

FIG. 9 illustrates for example a sectional illustration through the rear side of the book-type security document 30 in accordance with FIG. 8. A book cover insert 11 in accordance with FIG. 1 is introduced in this exemplary embodiment. In the case of the configuration of a reinforced endpaper 46, it is not necessary to close the perforation 17. The perforation 17 comprises a diameter of 4 mm, for example, so that its cutout cannot be sensed after application of the endpaper 46.

FIG. 10a illustrates a schematic sectional illustration through a book-type security document 30 constituting an alternative embodiment to FIG. 8. In this exemplary embodiment, the first layer 12 and the at least one further layer 16 are formed from a polymeric laminate layer. A data carrier 22 with a microchip 21 is provided between the layer 12 and the layer 16. The laminate layers 12 and 16 have an outer, peripheral, closed edge 66 by means of which the data carrier 22 is completely enclosed and embedded between the layers 12, 16. The data carrier 22 extends as far as the seam 45, thereby enabling the book binding 31 to be opened and closed without impairing the data carrier 22. The laminate layer 12, 16 is preferably produced by means of a roller laminating or an embossing pressing method, the lamination being effected under pressure and/or temperature. After the production of the laminate layer encapsulation 67 by the at least two laminate layers 12, 16, the edges are stamped and/or trimmed in order to encapsulate this laminate layer encapsulation 67 with a binding material 32 at least on the outer side, with the result that a book binding 31 is produced after application of the endpaper 46. The thickness of the layer 16 facing the endpaper 46 can be adapted to the thickness of the data carrier 22 with microchip 21, with the result that the book cover insert 33 is formed with an identical thickness both on the front side and on the rear side. As an alternative, it may be provided that the layers 12 and 16 are formed with different thicknesses or have at least in part stamped-out sections in order to receive the microchip 21 in order likewise to form a uniform thickness of a book cover insert 33. Furthermore, as illustrated in the exemplary embodiment, the front or rear side may have a larger thickness, whereas the rear side or front side may comprise a smaller thickness.

The laminate layer encapsulation 67 formed from the polymeric laminate layers 12, 16 may also be provided without binding material 32 or with partly stamped-out binding material 32, so that the outer laminate layer is at least partly visible and, by way of example, an embedded page with items of information is visible.

FIG. 10b illustrates an alternative embodiment to FIG. 10a. In the case of this embodiment, the data carrier 22 with a microchip 21 is applied on a polymeric laminate layer 16, the data carrier 22 preferably being formed in such a way that it reaches as far as the seam 45, or it is provided with a boundary shortly before the latter. The binding material 32 surrounds the laminate layer 16, the edges of the binding material being covered by an endpaper 46. In accordance with the exemplary embodiment, it may be provided that the layer 16 is reinforced by the layer 12. Consequently, an inner side with security features or the like may be introduced between the layer 12 and the layer 16 for the purpose of increasing the number of security features.

As an alternative to the embodiment illustrated in FIG. 10b, it may be provided that the data carrier 22 with microchip 12 is provided on the endpaper 46, the endpaper 46 being formed by the laminate layer 16 and the binding material being provided by the laminate layer 12. Furthermore, in the case of this exemplary embodiment, a further overlay film or the like may be applied to the data carrier 22 with microchip 21. These embodiments described with respect to FIG. 10b likewise constitute a flexible book binding 31.

As an alternative, it may also be provided that the book binding 31 is formed as a flexible book binding 31 on the front or rear side and the rear or front side is produced as a hard book binding 31.

A further arbitrary combination of the embodiments described for receiving at least one data carrier 22 with a microchip 21 is possible. Equally, a layer 12, 16 may be formed from paperboard, cardboard or the like and the at least one further layer 12, 16 may be provided by a polymeric laminate layer in order to position and fix the at least one data carrier 22 between the first layer 12 and the at least one further layer 16.

FIG. 11 illustrates the production process of the book-type security document 30. In a first step, individual pages 42 are ordered to form a book block 41 and the pass card 44 and also the endpaper 46 are connected to one another by e.g. the production of a seam 45. The pass card 44 has an edge region 49 projecting beyond the connecting seam 45. In the subsequent work step, the book block 41 is folded up and cut to format at the sides 51, 52 and 53 in order to supply said book block 41 to a book insetting machine. In this case, the front and back endpapers 46 are adhesively bonded on to the book binding 31, until the book-type security document 30 is completed. Between the work step of cutting the book block 31 to format and insetting into the book binding 32, the cut book block 41 is personalized 55 by introduction of a perforation into the pages of the book block 41, which corresponds for example to the personal identification number or other personal data of the pass card 44.

The individual method steps in accordance with FIGS. 5, 7 and 11 may also be interlinked in a work line. As an alternative, individual or a plurality of work steps may also be provided in an interchanged sequence in order to optimize automatic production.

The invention claimed is:

1. A method for the production of a book cover insert for a book binding, characterized in that at least one first layer, at least one second layer and at least one data carrier with microchip are provided, a cutout or perforation for receiving at least one part of the data carrier is introduced into the at least one layer, an adhesive layer is introduced at least on an inner side of the at least one first layer or a surface of the at least one data carrier with microchip which faces the inner side of the at least one first layer, a further adhesive layer is introduced at least on an inner side of the at least one second layer or a surface of the at least one data carrier with microchip which faces the inner side of the at least one second layer, the at least one data carrier with microchip is positioned to the cutout or perforation of the at least one layer and the at least one first layer, the data carrier with microchip and the at least one second layer are connected to one another under slight pressure to form a laminate layer encapsulation and in a subsequent working step after the production of the laminate layer encapsulation, a circumferential edge of the laminate layer encapsulation is stamped to a final format and the stamping to the final format is tailored to a reference size to which the perforation or the cutout is also geared, the at least one first layer and the at least one second layer are formed from at least one polymeric laminate layer, so that the laminate layer encapsulation with the circumferential edge around at least the one data carrier is produced by the at least one first layer and the at least one second layer forming an outer peripheral closed edge wherein the outer peripheral closed edge, together with the at least one first layer and the at least one second layer completely embed and completely enclose the at least one data carrier on all sides of the data carrier to form the book cover insert for the book binding.

2. The method as claimed in claim 1, characterized in that the first and at least one further layer are produced from at least one thermoplastic film or from a sandwichlike film combination comprising PVC, ABS, PET-G, PET, PE, PP, PA or teslin.

3. The method as claimed in claim 1, characterized in that a material containing an antenna substrate is used for the first or at least one further layer.

4. The method as claimed in claim 1, characterized in that the at least one first layer and the at least one second layer are joined together by heating a hot melt adhesive and the upper limit for the heating temperature is limited to 200° C.

5. The method as claimed in claim 1, characterized in that the at least one data carrier is positioned with respect to the at least one layer outside a gripper zone of the book cover insert.

* * * * *